United States Patent
Nagafuchi

(10) Patent No.: US 11,195,777 B2
(45) Date of Patent: Dec. 7, 2021

(54) SEMICONDUCTOR MODULE AND METHOD OF EVALUATING SEMICONDUCTOR MODULE

(71) Applicant: Mitsubishi Electric Corporation, Tokyo (JP)

(72) Inventor: Hiroaki Nagafuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 149 days.

(21) Appl. No.: 16/724,778

(22) Filed: Dec. 23, 2019

(65) Prior Publication Data
US 2020/0258809 A1 Aug. 13, 2020

(30) Foreign Application Priority Data
Feb. 8, 2019 (JP) .............................. JP2019-021115

(51) Int. Cl.
| | |
|---|---|
| H01L 23/373 | (2006.01) |
| H01L 21/66 | (2006.01) |
| H01L 23/42 | (2006.01) |
| H01L 23/367 | (2006.01) |

(52) U.S. Cl.
CPC .......... *H01L 23/3735* (2013.01); *H01L 22/12* (2013.01); *H01L 23/3672* (2013.01); *H01L 23/3675* (2013.01); *H01L 23/42* (2013.01)

(58) Field of Classification Search
None
See application file for complete search history.

(56) References Cited

U.S. PATENT DOCUMENTS

| | | |
|---|---|---|
| 2009/0016408 A1 | 1/2009 | Doan et al. |
| 2014/0368992 A1 | 12/2014 | Strader et al. |
| 2018/0171113 A1* | 6/2018 | Onishi ..................... C08K 3/14 |

FOREIGN PATENT DOCUMENTS

| | | | | |
|---|---|---|---|---|
| CN | 108463881 A | * | 8/2018 | ......... H01L 23/3737 |
| CN | 111394017 A | * | 7/2020 | |
| CN | 110023444 B | * | 7/2021 | |
| DE | 10 2013 206 868 A1 | | 5/2014 | |
| JP | 2012-038769 A | | 2/2012 | |
| JP | 2013-070085 A | | 4/2013 | |

(Continued)

OTHER PUBLICATIONS

An Office Action issued by the German Patent Office dated Feb. 15, 2021, which corresponds to German Patent Application No. 10 2020 200 779.9 and is related to U.S. Appl. No. 16/724,778 with English language translation.

*Primary Examiner* — Evren Seven
(74) *Attorney, Agent, or Firm* — Studebaker & Brackett PC

(57) ABSTRACT

An object is to provide a semiconductor module that ensures to determine a state of the thermally conductive material provided between a semiconductor device and a heat sink. The semiconductor module includes the semiconductor device, the thermally conductive material, and a controller. The thermally conductive material has a property of softening or melting at a specific temperature and is provided on one surface, which is mountable on the heat sink, of the outer surfaces of the semiconductor device. The controller determines the state of the thermally conductive material between the one surface of the semiconductor device and the heat sink based on temperature information on two different points in the semiconductor device.

8 Claims, 5 Drawing Sheets

(56) References Cited

FOREIGN PATENT DOCUMENTS

| JP | 2015-002351 | A | | 1/2015 | | |
|---|---|---|---|---|---|---|
| JP | 2016-163512 | A | | 9/2016 | | |
| JP | 6067969 | B2 | * | 1/2017 | ............... | C09J 7/38 |
| JP | WO2016063541 | A1 | * | 8/2017 | ............. | C08L 67/00 |
| WO | WO-2017217418 | A1 | * | 12/2017 | ............. | C08K 3/042 |
| WO | WO-2018021467 | A1 | * | 2/2018 | ............... | C08K 5/00 |
| WO | WO-2019111978 | A1 | * | 6/2019 | ............. | C04B 41/82 |

\* cited by examiner

SEMICONDUCTOR MODULE AND METHOD OF EVALUATING SEMICONDUCTOR MODULE

BACKGROUND OF THE INVENTION

Field of the Invention

The present invention relates to a semiconductor module and a method of evaluating the semiconductor module.

Description of the Background Art

Heat generated in an electronic device such as a semiconductor device is radiated to a heat sink (for example, Japanese Patent Application Laid-Open No. 2016-163512, Japanese Patent Application Laid-Open No. 2015-2351, Japanese Patent Application Laid-Open No. 2012-38769, Japanese Patent Application Laid-Open No. 2013-70085). Further, in a power module, grease provided between the power device and the heat sink improves the thermally conductivity from the power device to the heat sink (for example, Japanese Patent Application Laid-Open No. 2016-163512).

However, when the irregularities on the surfaces of the semiconductor device and the heat sink are not sufficiently filled with the grease and voids are generated, the heat generated in the semiconductor device is not sufficiently transferred to the heat sink. Therefore, the semiconductor device operates at an operating temperature higher than a normal or desirable operating temperature, which may adversely affect the reliability of the semiconductor device. The voids are generated when the amount of grease is less than the required amount, and even when the required amount of grease is applied in the manufacturing process, the voids are generated due to pump-out phenomenon. The pump-out phenomenon is a phenomenon in which the power device is deformed by repeated thermal stress and the grease flows out to the outside.

An intelligent power module described in Japanese Patent Laid-Open No. 2016-163512 records the initial values of the chip temperature and the case temperature after the module is assembled and then driven under a predetermined driving condition. The intelligent power module determines deterioration in the heat radiation environment such as a pump-out phenomenon based on these initial values and the chip temperature and case temperature detected at different timings.

When a thermally conductive material between the semiconductor device and the heat sink has a property of softening or melting at a specific temperature, the thermally conductive material is not necessarily filled all voids present between the semiconductor device and the heat sink immediately after the semiconductor device is mounted on the heat sink. After the semiconductor device is driven, the thermally conductive material is softened or melted by its heat generation to fill in the voids. At the stage where the thermally conductive material is softened or melted, the degree and state of the voids change, and a constant chip temperature and a case temperature cannot be obtained even under a certain driving condition. In order to determine the initial values of the chip temperature and the case temperature, it is necessary to clarify the state of the thermally conductive material between the semiconductor device and the heat sink.

SUMMARY

An object of the present invention is to provide a semiconductor module that ensures to determine a state of the thermally conductive material provided between a semiconductor device and a heat sink.

A semiconductor module according to the present invention includes a semiconductor device, a thermally conductive material, and a controller. The thermally conductive material has a property of softening or melting at a specific temperature and is provided on one surface, which is mountable on the heat sink, of the outer surfaces of the semiconductor device. The controller determines the state of the thermally conductive material between the one surface of the semiconductor device and the heat sink based on temperature information of two different points in the semiconductor device.

According to the present invention, a semiconductor module that determines a state of a thermally conductive material provided between a semiconductor device and a heat sink is provided.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
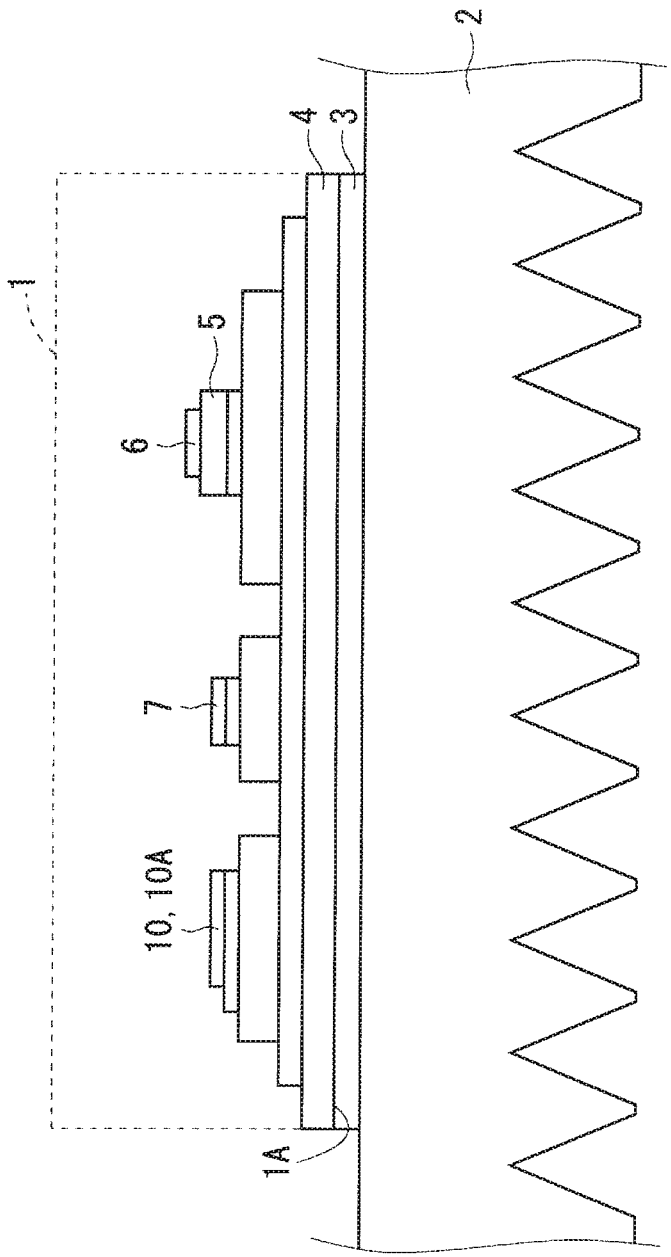
FIG. 1 is a cross-sectional view illustrating a configuration of a semiconductor module according to Embodiment 1.
Figure 2:
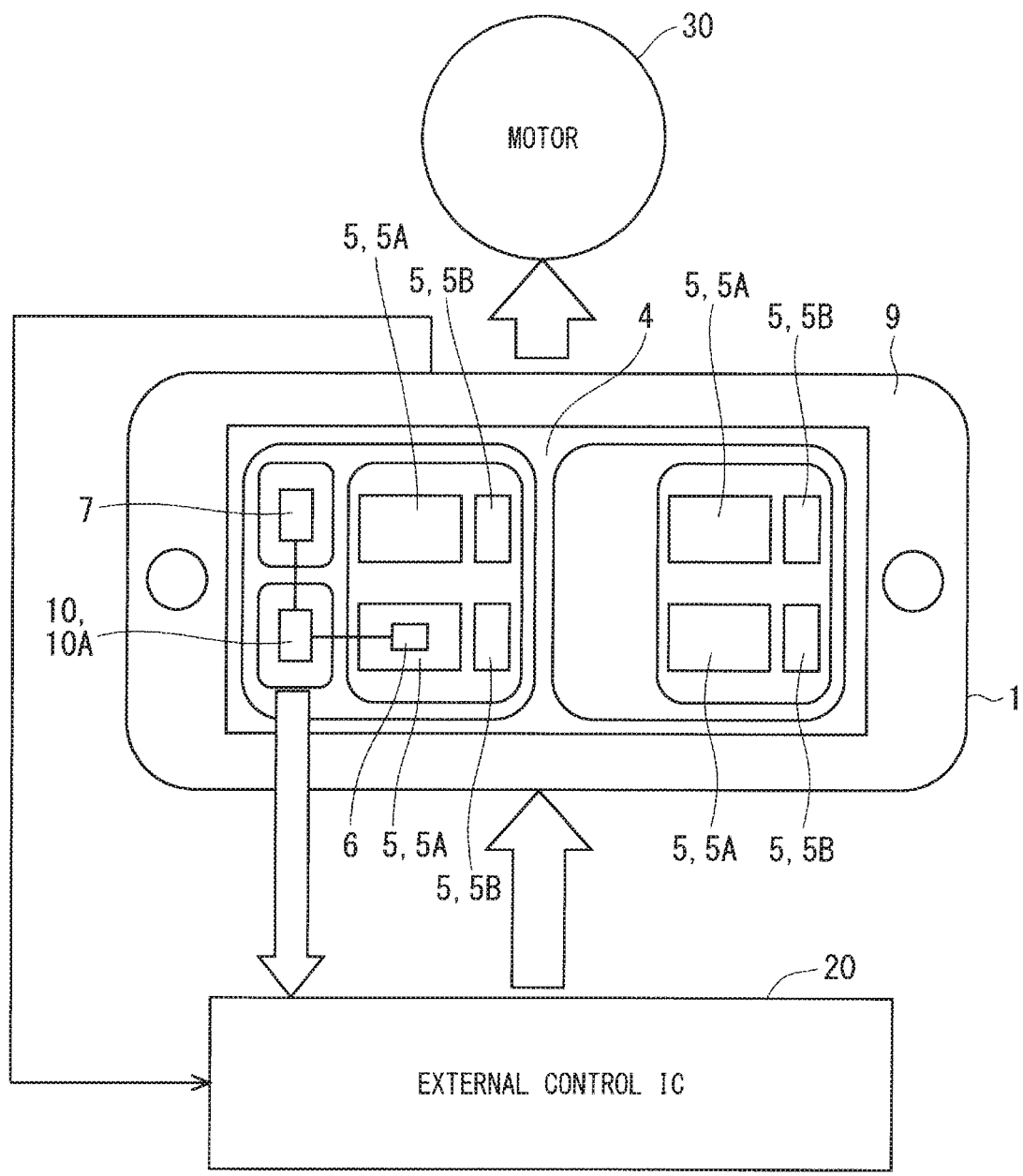
FIG. 2 is a plan view illustrating the configuration of the semiconductor module according to Embodiment 1.

FIG. 1 is a cross-sectional view illustrating a configuration of a semiconductor module according to Embodiment 1. FIG. 2 is a plan view illustrating the configuration of the semiconductor module.

The semiconductor module includes a semiconductor device 1, a heat sink 2, a thermally conductive material 3, and a controller 10. In FIG. 2, the heat sink 2 is omitted.

The semiconductor device 1 includes a base plate 4, a semiconductor chip 5, an on-chip temperature sensor 6, a thermistor 7, and a control integrated circuit (IC) 10A in a case 9. The semiconductor chip 5, the on-chip temperature sensor 6, the thermistor 7 and the control IC 10A are provided on the front surface side of the base plate 4. In Embodiment 1, the control IC 10A is built in the semiconductor device 1.

The thermally conductive material 3 is provided on one surface 1A, which is mountable on the heat sink 2, of the outer surfaces of the semiconductor device 1. In Embodiment 1, the one surface 1A is the rear surface of the base plate 4. The thermally conductive material 3 transfers heat from the semiconductor device 1 to the heat sink 2. The thermally conductive material 3 fills the irregularities present on the rear surface of the base plate 4 and the contact surface of the heat sink 2, so that the heat generated in the semiconductor device 1 is efficiently conducted to the heat sink 2.

The thermally conductive material 3 includes, for example, a Thermal Interface Material (TIM). The TIM includes, for example, a material that undergoes a phase change at a specific temperature, a material that has thermoplasticity, or grease that does not have such properties. Hereinafter, in Embodiment 1, a case where the thermally conductive material 3 has a property of softening or melting at a specific temperature will be described. The thermally conductive material 3 is softened or melted at a specific temperature (for example, 45° C.) or higher due to heat generation of the semiconductor device 1, and solidified or increased in viscosity at a specific temperature or lower. In that case, even if the necessary amount of the thermally conductive material 3 is applied in the assembly process of the semiconductor module, due to viscosity (fluidity) of the thermally conductive material 3 before the heat generation, or before driving, voids are not filled therein. After the semiconductor device 1 is driven, the thermally conductive material 3 is softened or melted by the heat generation, thereby the voids are filled. Thus, when the thermally conductive material 3 has a property of softening or melting at a specific temperature, a certain time is required until the voids between the semiconductor device 1 and the heat sink 2 are filled therewith.

The heat sink 2 absorbs heat generated by loss during operation of the semiconductor device 1 via the thermally conductive material 3 and radiates the heat to the outside. A leading factor of the loss is in the semiconductor chip 5.

The semiconductor chip 5 is a power chip including a wide-band-gap semiconductor such as SiC or GaN, for example. The power chip includes, for example, an Insulated Gate Bipolar Transistor (IGBT), a Metal Oxide Semiconductor Field Effect Transistor (MOSFET), a Schottky barrier diode, or the like. As an example of the semiconductor chip 5, FIG. 2 illustrates an IGBT chip 5A and a Free Wheeling Diode (FWD) chip 5B.

The on-chip temperature sensor 6 is provided on the semiconductor chip 5 and detects the chip temperature Tj of the semiconductor chip 5. Here, the on-chip temperature sensor 6 is provided on the IGBT chip 5A.

The thermistor 7 detects the case temperature Tc in the case 9. The thermistor 7 is provided on an insulating substrate, for example.

The control IC 10A is the controller 10 in Embodiment 1, and realizes the function of the controller 10. The control IC 10A determines the state of the thermally conductive material 3 between the one surface 1A of the semiconductor device 1 and the heat sink 2 based on temperature information on two different points in the semiconductor device 1. In Embodiment 1, the temperature information on the two different points is a temperature difference between the chip temperature Tj and the case temperature Tc.

In addition, when the temperature difference between the chip temperature Tj and the case temperature Tc has been constant for a predetermined time after the semiconductor device 1 is energized, the control IC 10A determines that the thermally conductive material 3 is filled in the voids between the semiconductor device 1 and the heat sink 2. Then, the control IC 10A records the temperature difference between the chip temperature Tj and the case temperature Tc at that time as an initial value. Based on the initial value, the control IC 10A determines an abnormality in the heat radiation environment of the semiconductor module, such as the occurrence of the pump-out phenomenon. At that time, information on a current value output from the semiconductor device 1 is fed back to the control IC 10A, and the control IC 10A detects abnormalities in the heat radiation environment based on the current value in addition to the above temperature information on the two different points. Further, the control IC 10A may output saturation detection information related to the temperature difference to an external control IC 20.

The control IC 10A has a function of switching a determination flag indicating the state of the thermally conductive material 3. The determination flag mounted on the control IC 10A is switched by a change in the state of the thermally conductive material 3, such as when the thermally conductive material 3 is softened or melted to fill the voids, or when the thermally conductive material flows out. That is, the determination flag is switched in response to a change in the heat radiation environment of the semiconductor module. In the initial stage of energization of the semiconductor device 1, the determination flag is, for example, used for determining whether or not the thermally conductive material 3 is softened or melted to fill the voids between the semiconductor device 1 and the heat sink 2. Thereafter, the determination flag is used for determining any abnormality in the heat radiation environment in the semiconductor module, for example, outflowing (the pump-out phenomenon) of the thermally conductive material 3, stop of the air cooling fan, or the like.

The control IC 10A includes a memory for storing temperature information of two different points, the determination flag, and the like. Further, the above functions of the control IC 10A are realized by the control IC 10A executing a program stored in the memory.

Further, the external control IC 20 illustrated in FIG. 2 outputs a control pulse signal for driving the semiconductor chip 5 and the like. When the semiconductor chip 5 is a power chip, the semiconductor device 1 is a power device and the semiconductor module is a power module. The power module controls driving of a motor 30 and the like illustrated in FIG. 2.

Figure 3:
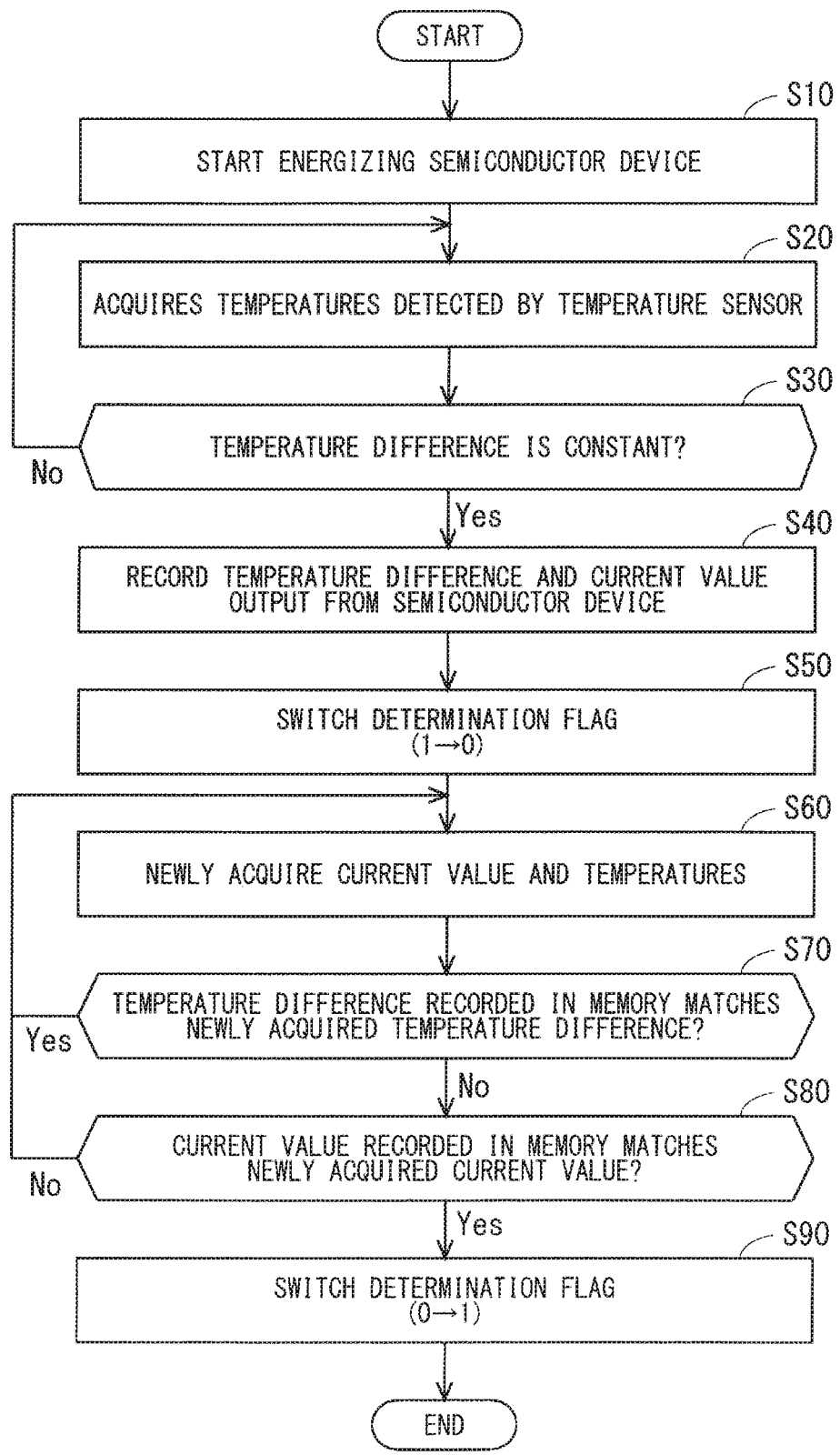
FIG. 3 is a flowchart illustrating a method of evaluating the semiconductor module according to Embodiment 1.
Figure 4:
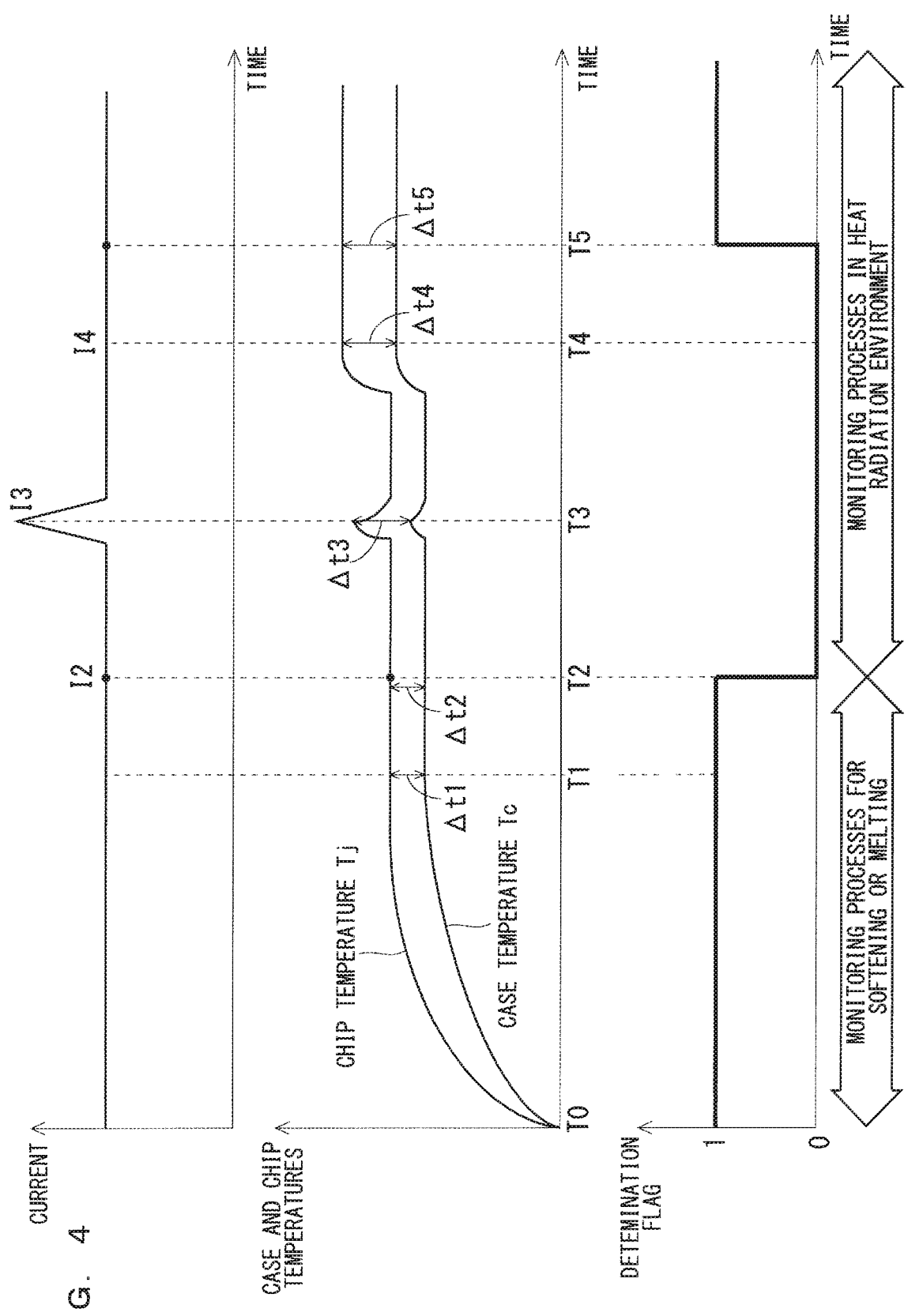
FIG. 4 is a timing chart illustrating the method of evaluating the semiconductor module according to Embodiment 1.

FIG. 3 is a flowchart illustrating a method of evaluating the semiconductor module according to Embodiment 1. Also, FIG. 4 is a timing chart illustrating the method of evaluating the semiconductor module.

In Step S10, the external control IC 20 starts energizing the semiconductor device 1 under a predetermined driving condition. The time T0 in FIG. 4 is the energization start timing.

In Step S20, the control IC 10A acquires temperatures at two different points detected by the temperature sensors. Here, the on-chip temperature sensor 6 detects the chip temperature Tj, and the thermistor 7 detects the case temperature Tc. When the voids exist between the semiconductor device 1 and the heat sink 2 before the thermally conductive material 3 is softened or melted, the chip temperature Tj and the case temperature Tc keep on rising after the start of energization, as illustrated in FIG. 4. From time T0 to T1, the temperatures of the semiconductor device 1 and the heat sink 2 are not saturated.

In step S30, the control IC 10A determines whether or not the temperature difference between chip temperature Tj and case temperature Tc has been constant for a predetermined time. When the temperature difference has been constant, Step S40 is executed. When the temperature difference has not been constant, Step S20 is re-executed. In FIG. 4, as the temperature difference has been constant from time T1 to T2 ($\Delta t1 = \Delta t2$), the control IC 10A determines that the thermally conductive material 3 is filled in the voids between the semiconductor device 1 and the heat sink 2.

In Step S40, the control IC 10A records the temperature difference and the current value output from semiconductor device 1 in the memory. In FIG. 4, the temperature difference Δt2 and the current value I2 at time T2 are recorded in the memory. These recorded temperature difference and current value correspond to initial values.

In Step S50, the control IC 10A switches the determination flag. For example, as illustrated in FIG. 4, the control IC 10A switches the determination flag from "1" to "0". Steps S10 to S50 above are monitoring processes for softening or melting of the thermally conductive material 3. In subsequent Step S60 and following steps thereafter, based on the initial values recorded in Step S40, the control IC 10A determines an abnormality in the heat radiation environment of the semiconductor module, such as the occurrence of the pump-out phenomenon.

In Step S60, the control IC 10A newly acquires a current value output from the semiconductor chip 5 and temperatures at two different points detected by the temperature sensors. Here, the on-chip temperature sensor 6 detects the chip temperature Tj, and the thermistor 7 detects the case temperature Tc, similarly to Step S20.

In step S70, the control IC 10A determines whether or not the temperature difference Δt2 recorded in the memory matches a temperature difference based on the newly acquired temperatures. When the two temperature differences match each other, Step S60 is re-executed. When the two temperature differences do not match each other, Step S80 is executed. For example, as illustrated in FIG. 4, the temperature difference Δt3 at time T3 and the temperature difference Δt4 at time T4 are different from the temperature difference Δt2 stored in the memory. Accordingly, Step S80 is executed.

In step S80, the control IC 10A determines whether or not the current value I2 stored in the memory matches the newly acquired current value. When the two current values do not match each other, Step S60 is re-executed. For example, the current value I3 at time T3 is different from the current value I2 recorded in the memory. Therefore, the control IC 10A does not determine that an abnormality has occurred in the heat radiation environment of the semiconductor module, and does not change the determination flag. When the two current values match each other, Step S90 is executed. For example, the current value I4 at time T4 matches the current value I2 stored in the memory. Therefore, the control IC 10A determines that an abnormality has occurred in the heat radiation environment of the semiconductor module.

In Step S90, the control IC 10A switches the determination flag. For example, as illustrated in FIG. 4, the control IC 10A switches the determination flag from "0" to "1". With switching of the determination flag, the control IC 10A may notify the external device that an abnormality has occurred in the heat radiation environment of the semiconductor module by outputting a signal to the external device. Steps S60 to S90 above are monitoring processes on an abnormality in the heat radiation environment of the semiconductor module.

This is the end of the method of evaluating the semiconductor module.

In step S70, when the temperature difference based on the newly acquired temperatures does not match the temperature difference Δt2 recorded in the memory, the control IC 10A may determine whether or not the unmatched temperature difference has been constant for a predetermined time. For example, the temperature difference Δt4 in FIG. 4 does not match the temperature difference Δt2, and has been constant from time T4 to time T5 (Δt4=Δt5). In that case, Step S80 is executed.

In Embodiment 1, the on-chip temperature sensor 6 and the thermistor 7 are mere examples, and the temperature sensors are not limited thereto. Further, the temperature information on the two different points is not limited to the temperature difference between the chip temperature Tj and the case temperature Tc. The two points having a constant temperature difference during saturation can exhibit the same effect. For example, when the semiconductor module has another thermistor in the semiconductor device 1 instead of the on-chip temperature sensor 6, the control IC 10A determines that the state of the thermally conductive material 3 based on the temperature difference between two different points of case temperatures.

Further, in Embodiment 1, although one control IC 10A has a function of recording the temperature information on the two different points, determining the state of the thermally conductive material 3, determining an abnormality in the heat radiation environment, and switching the determination flag, these functions may be realized by distributing to a plurality of control ICs.

In summary, the semiconductor module in Embodiment 1 includes the semiconductor device 1, the thermally conductive material 3, and the controller 10 (control IC 10A). The thermally conductive material 3 has a property of softening or melting at a specific temperature and is provided on one surface 1A, which is mountable on the heat sink 2, of the outer surfaces of the semiconductor device 1. The controller 10 (control IC 10A) determines the state of the thermally conductive material 3 between the one surface 1A of the semiconductor device 1 and the heat sink 2 based on the temperature information on the two different points in the semiconductor device 1.

With the above configuration, the semiconductor module determines the state of the thermally conductive material 3 provided between the semiconductor device 1 and the heat sink 2. For example, the semiconductor module determines that the thermally conductive material 3 is filled in the voids between the semiconductor device 1 and the heat sink 2. Thereby, the semiconductor module determines initial values of the temperature information on the two different points in the semiconductor device 1. Then, the semiconductor module detects abnormalities in the heat radiation environment such as a change in characteristics of the thermally conductive material 3 or the pump-out phenomenon.

Further, the two different points corresponding to the temperature information are not limited as long as they are within the semiconductor device 1; therefore, the degree of freedom in designing the semiconductor device 1 is improved.

The semiconductor device 1 of the semiconductor module according to Embodiment 1 includes the semiconductor chip 5, the case 9, the first temperature sensor (the on-chip temperature sensor 6), and the second temperature sensor (the thermistor 7). The case 9 accommodates the semiconductor chip 5. The on-chip temperature sensor 6 detects the chip temperature Tj that is a temperature of the semiconductor chip 5. The thermistor 7 detects a case temperature Tc that is a temperature in the case 9. The temperature information on the two different points includes a temperature difference between the chip temperature Tj and the case temperature Tc.

Such a semiconductor module determines the state of the thermally conductive material 3 based on the chip temperature Tj and the case temperature Tc; therefore, the determination accuracy is improved.

The controller 10 of the semiconductor module in Embodiment 1 includes a control IC 10A built in the semiconductor device 1. The control IC 10A determines the state of the thermally conductive material 3 based on the temperature information on the two different points.

In the semiconductor module with the above configuration, the control IC 10A is built in the semiconductor device 1; therefore, another device having the function of the control IC 10A need not to be prepared. In addition, the semiconductor module having the function can be realized in a compact manner.

Further, the controller 10 of the semiconductor module in Embodiment 1 determines the state of the thermally conductive material 3 by the determination flag.

By using the determination flag, the semiconductor module determines the state of the thermally conductive material 3 after the thermally conductive material 3 is filled in the voids between the semiconductor device 1 and the heat sink 2. Similarly, the semiconductor module determines the state of the thermally conductive material 3 until abnormalities in the heat radiation environment such as outflowing of the grease or stop of air cooling fan or the like due to long-term use of the semiconductor device 1 occur.

In the semiconductor module according to Embodiment 1, the temperature information on the two different points includes a temperature difference between the two different points. In addition, when the temperature difference has been constant for a predetermined time after the semiconductor device 1 is energized, the controller 10 (control IC 10A} determines that the thermally conductive material 3 is filled in the voids between the semiconductor device 1 and the heat sink 2.

With the above configuration, the semiconductor module determines that the thermally conductive material 3 is filled in the voids between the semiconductor device 1 and the heat sink 2. Thereby, the semiconductor module determines initial values of the temperature information on the two different points in the semiconductor device 1. Then, the semiconductor module detects abnormalities in the heat radiation environment such as a change in characteristics of the thermally conductive material 3 or the pump-out phenomenon.

A method of evaluating the semiconductor module according to Embodiment 1 is a method of evaluating a semiconductor module including the semiconductor device 1. The method of evaluating a semiconductor module includes mounting the semiconductor device 1 on the heat sink 2 via the thermally conductive material 3 having the property of softening or melting at a specific temperature. The thermally conductive material 3 is provided on the one surface 1A, which is mountable on the heat sink 2, of the outer surfaces of the semiconductor device 1. The method further includes determining the state of the thermally conductive material 3 between the one surface 1A of the semiconductor device 1 and the heat sink 2 based on the temperature information on the two different points in the semiconductor device 1.

With the method of evaluating of the semiconductor module with the above configuration, the state of the thermally conductive material 3 provided between the semiconductor device 1 and the heat sink 2 can be determined.

And in the method of evaluating the semiconductor module according to Embodiment 1, the temperature information on the two different points includes a temperature difference between the two different points. In addition, when the temperature difference has been constant for a predetermined time after the semiconductor device 1 is energized, the method of evaluating a semiconductor module determines that the thermally conductive material 3 is filled in the voids between the semiconductor device 1 and the heat sink 2.

The method of evaluating a semiconductor module determines that the thermally conductive material 3 is filled in the voids between the semiconductor device 1 and the heat sink 2. Thereby, the semiconductor module determines initial values of the temperature information on the two different points in the semiconductor device 1. Then, abnormalities in the heat radiation environment such as a change in characteristics of the thermally conductive material 3 or the pump-out phenomenon are detected.

Embodiment 2

A semiconductor module and a method of evaluating the semiconductor module according to Embodiment 2 will be described. Note that the description of the same configuration and operation as in Embodiment 1 is omitted.

Figure 5:
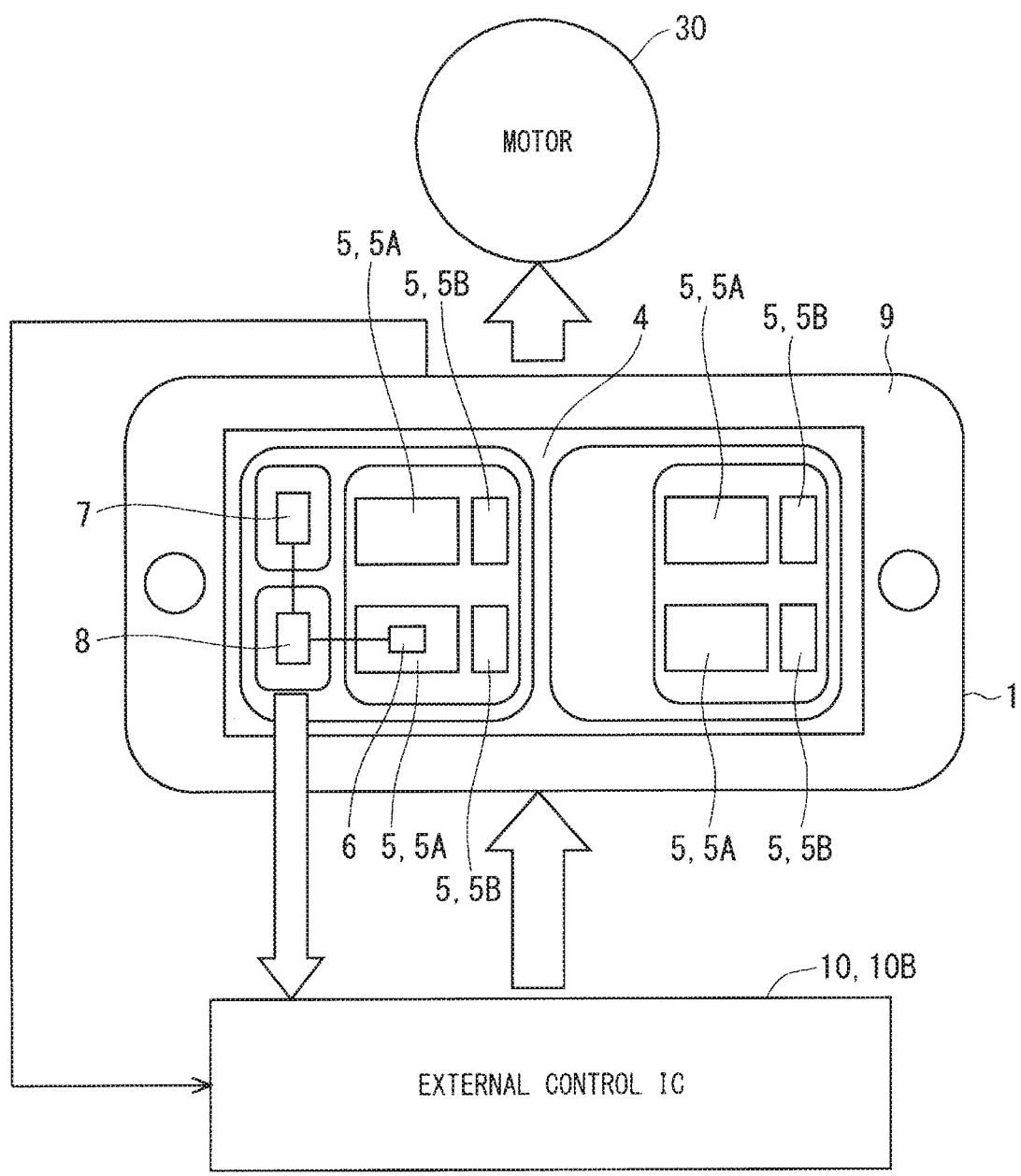
FIG. 5 is a plan view illustrating a configuration of a semiconductor module according to Embodiment 2.

FIG. 5 is a plan view illustrating a configuration of the semiconductor module according to Embodiment 2. Although in Embodiment 1, the function of the controller 10 is realized by the control IC 10A built in the semiconductor device 1, the function of the controller 10 in Embodiment 2 is realized by an external control IC 10B provided outside the semiconductor device 1.

The semiconductor device 1 outputs temperature information on two different points to the external control IC 10B. For example, a control IC 8 of the semiconductor device 1 outputs a chip temperature Tj detected by the on-chip temperature sensor 6 and a case temperature Tc detected by the thermistor 7 to the external control IC 10B. The external control IC 10B determines the state of the thermally conductive material 3 based on the temperature information on the two different points similarly to Embodiment 1.

The semiconductor device 1 is not required to incorporate the function of the controller 10 in the semiconductor module; therefore, the configuration of the semiconductor device 1 is simplified.

It should be noted that Embodiments of the present invention can be arbitrarily combined and can be appropriately modified or omitted without departing from the scope of the invention.

While the invention has been described in detail, the forgoing description is in all aspects illustrative and not restrictive. It is therefore understood that numerous other modifications and variations can be devised without departing from the scope of the invention.

What is claimed is:

1. A semiconductor module, comprising:
 a semiconductor device;
 a thermally conductive material having a property of softening or melting at a specific temperature and provided on one surface, which is mountable on a heat sink, of the outer surfaces of the semiconductor device; and
 a controller configured to determine a state of the thermally conductive material between the one surface of the semiconductor device and the heat sink based on temperature information on two different points in the semiconductor device.

2. The semiconductor module according to claim 1, wherein
 the semiconductor device includes
 a semiconductor chip, a case accommodating the semiconductor chip, a first temperature sensor configured to detect a chip temperature that is a temperature of the semiconductor chip, and a second temperature sensor configured to detect a case temperature that is a temperature in the case, and the temperature information of the two different points includes a temperature difference between the chip temperature and the case temperature.

3. The semiconductor module according to claim 1, wherein the controller includes a control IC built in the semiconductor device, and the control IC is configured to determine the state of the thermally conductive material based on the temperature information of the two different points.

4. The semiconductor module according to claim 1, wherein the controller includes an external control IC provided outside the semiconductor device, and the external control IC is configured to determine the state of the thermally conductive material based on the temperature information of the two different points.

5. The semiconductor module according to claim 1, wherein the controller is configured to determine the state of the thermally conductive material by a determination flag.

6. The semiconductor module according to claim 1, wherein the temperature information of the two different points includes a temperature difference between the two different points, and the controller is configured to determine that the thermally conductive material is filled in voids between the semiconductor device and the heat sink when the temperature difference has been constant for a predetermined time after the semiconductor device is energized.

7. A method of evaluating a semiconductor module including a semiconductor device, the method comprising:

mounting the semiconductor device on a heat sink via a thermally conductive material having a property of softening or melting at a specific temperature and provided on one surface, which is mountable on the heat sink, of the outer surfaces of the semiconductor device; and determining a state of the thermally conductive material between the one surface of the semiconductor device and the heat sink based on temperature information on two different points in the semiconductor device.

8. The method of evaluating the semiconductor module according to claim 7, wherein the temperature information of the two different points includes a temperature difference between the two different points, and the method determines that the thermally conductive material is filled in voids between the semiconductor device and the heat sink when the temperature difference has been constant for a predetermined time after the semiconductor device is energized.

* * * * *